United States Patent [19]

Yamaguchi

[11] Patent Number: 4,733,112

[45] Date of Patent: Mar. 22, 1988

[54] SENSE AMPLIFIER FOR A SEMICONDUCTOR MEMORY DEVICE

[75] Inventor: Takashi Yamaguchi, Tokyo, Japan

[73] Assignee: NEC Corporation, Tokyo, Japan

[21] Appl. No.: 923,197

[22] Filed: Oct. 27, 1986

[30] Foreign Application Priority Data

Oct. 28, 1985 [JP] Japan .................. 60-242046

[51] Int. Cl.⁴ .................. H03K 3/356; H03K 17/04; H03K 19/017; H03K 17/687
[52] U.S. Cl. .................. 307/530; 307/279; 307/451; 365/205; 365/196
[58] Field of Search ............. 307/530, 451, 452, 453, 307/496, 497, 553, 279, 291; 365/196, 205, 207, 208, 227

[56] References Cited

U.S. PATENT DOCUMENTS

| | | | |
|---|---|---|---|
| 3,588,848 | 6/1971 | Van Beek | 307/279 |
| 3,631,528 | 12/1971 | Green | 307/279 |
| 4,558,241 | 12/1985 | Suzuki et al. | 307/530 |
| 4,644,197 | 2/1987 | Flannagan | 307/530 |

FOREIGN PATENT DOCUMENTS

| | | | |
|---|---|---|---|
| 0070990 | 5/1980 | Japan | 365/207 |
| 0158095 | 9/1983 | Japan | 365/227 |
| 0160883 | 9/1984 | Japan | 365/222 |

Primary Examiner—Stanley D. Miller
Assistant Examiner—Trong Quang Phan
Attorney, Agent, or Firm—Sughrue, Mion, Zinn, Macpeak & Seas

[57] ABSTRACT

A sense amplifier circuit operable at high speed, but having reduced power dissipation. The amplifier has two input lines, each receiving a respective voltage that differs from the other. A differential amplifier is connected between sources of high and low voltage levels and also has a pair of input terminals respectively connected to the first and second input lines. The amplifier also has first and second inverters, each having an input terminal and an output terminal, the input terminal of the first inverter being connected to the first input line and the input terminal of the second inverter being connected to the second input line. A first series combination of at least two transistors is provided between the first input line and the source of low level voltage, one of the two transistors having a control terminal connected to the output terminal of the first inverter. A second series combination of at least two transistors is proided between the second input line and the source of the low level voltage, one of the transistors of the second series combination having a control terminal connected to the output terminal of te second inverter.

8 Claims, 6 Drawing Figures

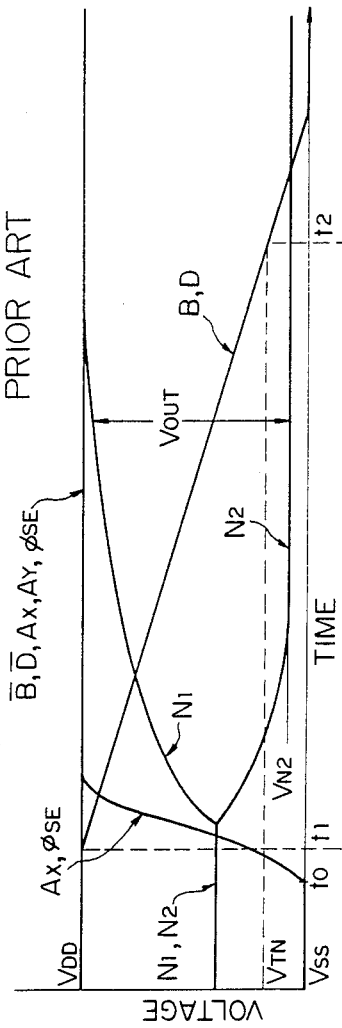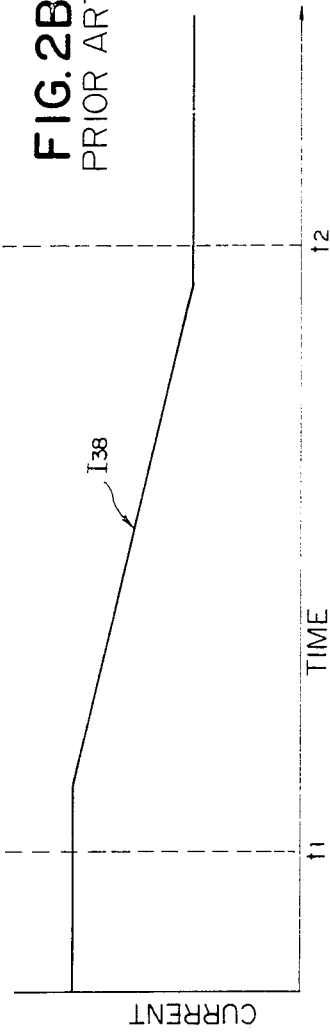

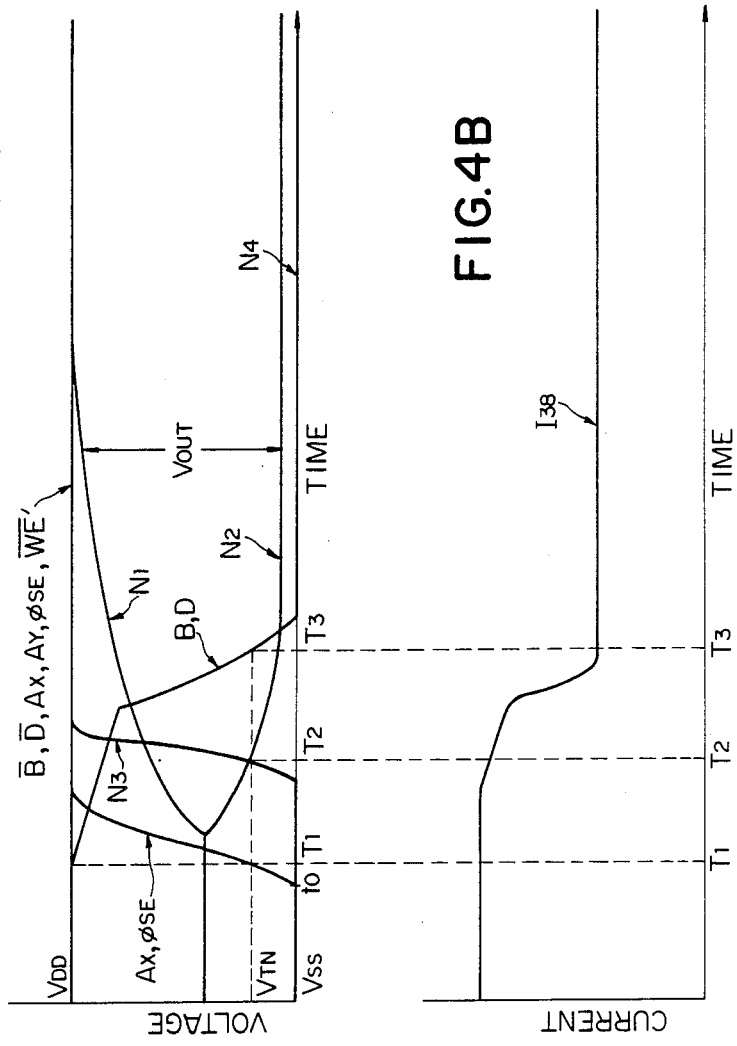

SENSE AMPLIFIER FOR A SEMICONDUCTOR MEMORY DEVICE

FIELD OF THE INVENTION

The present invention relates to a semiconductor memory device and, more particularly, to a semiconductor memory device with a differential amplifier circuit useful as a sense amplifier in the memory device.

BACKGROUND OF THE INVENTION

A semiconductor memory device has a sense amplifier designed to detect a slight differences between the potentials on two mutually associated bit lines of a memory array which consists of a multiplicity of memory cells. Such a differential voltage between the two bit lines is detected upon amplification by the sense amplifier. Such a sense amplifier basically consists of two series combinations of transistors provided between a supply voltage and a ground line. When one of the memory cells is selected so that the potential on one of the complementary bit lines associated with the particular cell declines, the current path provided through one of these two series combinations of transistors also declines until the current path is blocked with one of the transistors forming the particular transistor combination turned off. A considerably large amount of current is thus allowed to path through one combination of transistors in addition to the current which passes through the other combination of transistors until the current path formed by the former is blocked. This gives rise to an increase in the amount of power dissipation by the memory device.

It is accordingly a prime object of the present invention to provide an improved sense amplifier circuit in which the current allowed to flow through the amplifier circuit during each cycle of operation of the circuit is significantly reduced at an early point of time during the cycle of operation.

SUMMARY OF THE INVENTION

In accordance with one important aspect of the present invention, there is provided a sense amplifier circuit including (a) first and second input lines to which voltages with a difference therebetween are to be applied respectively, (b) a differential amplifier provided between sources of voltages of high and low levels and having a pair of input terminals respectively connected to the first and second input lines, characterized by (c) first and second inverter means each having an input terminal and an output terminal, the input terminal of the first inverter means being connected to the first input line and the input terminal of the second inverter means being connected to the second input line, (d) a first series combination of at least two transistors provided between the first input line and the source of the voltage of low level, one of the two transistors having a control terminal connected to the output terminal of the first inverter means, and (e) a second series combination of at least two transistors provided between the second input line and the source of the voltage of low level, one of the transistors of the second series combination having a control terminal connected to the output terminal of the second inverter means.

In accordance with another important aspect of the present invention, there is provided a differential amplifier circuit including (a) first and second input lines to which potentials with a difference therebetween are to be applied respectively, (b) a series combination of a first load transistor and a first amplifier transistor provided between sources of voltages of high and low levels, (c) a series combination of a second load transistor and a second amplifier transistor provided between the sources of the voltages of high and low levels, and (d) activating means provided in association with the first and second amplifier transistors for activating each of the first and second amplifier transistors when the activating means is actuated, (e) each of the first and second load transistors, the first and second amplifier transistors and the activating transistor having a control terminal, the control terminal of the first amplifier transistor being connected to the first input line and the control terminal of the second amplifier transistor being connected to the second input line, characterized by (f) first and second inverter means each having an input terminal and an output terminal, the input terminal of the first inverter means being connected to the first input line and the input terminal of the second inverter means being connected to the second input line, (g) a first series combination of at least two transistors provided between the first input line and the source of the voltage of low level, one of the two transistors having a control terminal connected to the output terminal of the first inverter means, and (h) a second series combination of at least two transistors provided between the second input line and the source of the voltage of low level, one of the transistors of the second series combination having a control terminal connected to the output terminal of the second inverter means.

BRIEF DESCRIPTION OF THE DRAWINGS

The drawbacks of a prior-art sense amplifier and the features and advantages of a differential amplifier circuit according to the present invention will be more clearly understood from the following description taken in conjunction with the accompanying drawings in which like reference numerals designate similar or corresponding units and elements and in which:

FIGS. 2A and 2B are timecharts showing examples of the waveforms of various voltages and currents to appear in the circuit arrangement of the sense amplifier shown in FIG. 1;

FIGS. 4A and 4B are timecharts showing examples of the waveforms of various voltages and currents to appear in the circuit arrangement of the sense amplifier circuit shown in FIG. 3.

DESCRIPTION OF THE PRIOR ART

Figure 1:
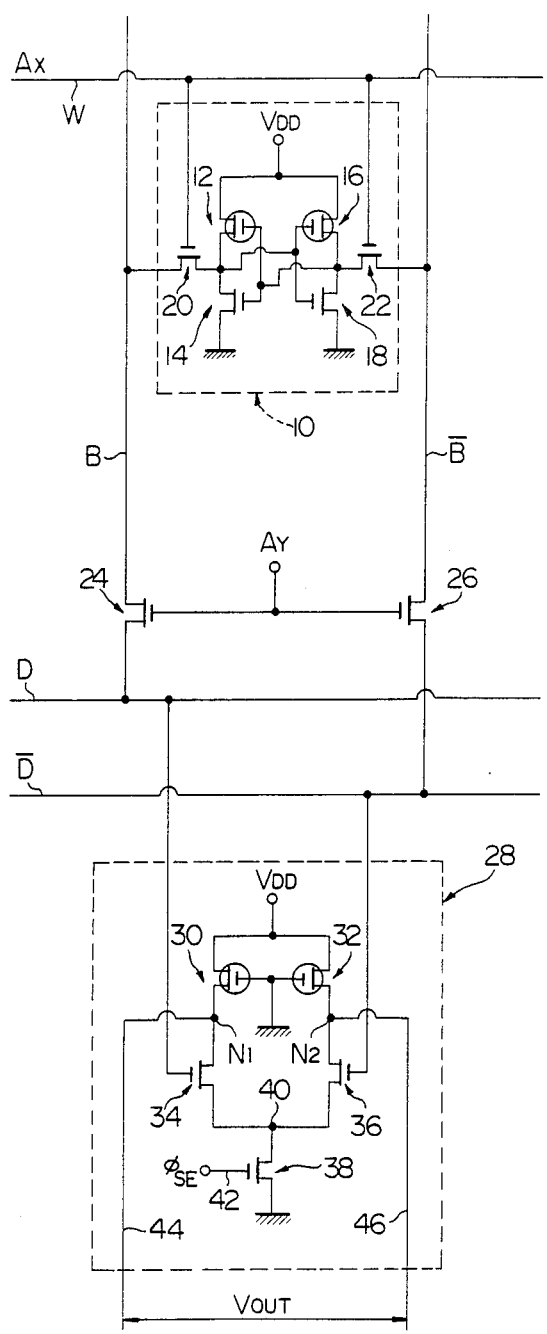
FIG. 1 is a circuit diagram showing the circuit arrangement of a representative example of a static semiconductor memory device incorporating a prior-art sense.

In FIG. 1 of the drawings is shown a known static random access memory device having a word line W and a pair of mutually complementary bit lines B and $\bar{B}$. The shown word line W represents a plurality of word lines and, likewise, the shown bit lines B and $\bar{B}$ represent a plurality of bit line pairs provided in a memory array consisting of a number of memory cells. In FIG. 1, these memory cells of the array are shown represented by a memory cell 10 provided in association with the word line W and bit lines B and $\bar{B}$. Though not shown, the word lines including the shown word line W of the memory cells 10 are all connected to and are to be selectively activated by a row address decoder. When the shown word line W is selected by the row address decoder, a word line select signal represented by $A_X$ is supplied from the row address decoder to the word line W. Likewise, the bit line pairs including the bit line pair B/$\bar{B}$ herein shown are all connected to and are to be selectively activated by a column address decoder, not shown in the drawings. When the shown bit line pair B/$\bar{B}$ is selected by the column address decoder, a bit line select signal represented by $A_Y$ is supplied from the column address decoder to each of the bit lines B and $\bar{B}$.

The memory cell 10 is assumed to be of the CMOS (complementary metal-oxide-semiconductor) design and includes first and second CMOS inverters arranged to form a flip-flop circuit. The first CMOS inverter consists of a load transistor 12 and an inverter transistor 14 and, similarly, the second CMOS inverter consisting of a load transistor 16 and an inverter transistor 18. Each of the load transistors 12 and 16 is herein provided by a p-channel MOS field-effect transistor and each of the inverter transistors 14 and 18 is provided by an n-channel MOS field-effect transistor, a p-channel field-effect transistor being shown enclosed within a circle for being distinguished from an n-channel field-effect transistor. The load transistors 12 and 16 have their gates respectively connected to the gates of the n-channel field-effect transistors 14 and 18, and their sources commonly connected to a source of a supply voltage $V_{DD}$. The drains of the transistors 12 and 16 are connected to the drains of the inverter transistors 14 and 18, respectively, which have their sources connected to ground line. The memory cell 10 further includes first and second gating transistors 20 and 22 each of which is implemented by an n-channel field-effect transistor. The first gating transistor 20 has its gate connected to the word line W and its source and drain connected between the true bit line B and a node between the common drains of the transistors 12 and 14 forming the first inverter. This node between the common drains of the transistors 12 and 14 is also connected to a node between the common gates of the transistors 16 and 18 forming the second inverter. Similarly, the second gating transistor 22 has its gate connected to the word line W and its source and drain connected between the complementary bit line $\bar{B}$ and a node between the common drains of the transistors 16 and 18 forming the second inverter. This node between the common drains of the transistors 16 and 18 is also connected to a node between the common gates of the transistors 12 and 14 forming the first inverter.

The six-transistor static CMOS memory cell 10 thus constructed is well known in the art and, for this reason, the details regarding the operation of the cell 10 will not be herein described. For purposes of discussion, it is herein assumed by way of example that the memory cell 10 has stored therein a logic "0" bit of information. A potential of low or ground level is thus established at the node between the common drains of the transistors 12 and 14, viz., the output node of the first inverter and a potential of high level established at the node between the common drains of the transistors 16 and 18, viz., the output node of the second inverter. Under this condition, the p-channel load transistor 12 is held in a non-conduction state and the n-channel inverter transistor 14 in a conduction state in the first inverter, while the p-channel load transistor 16 is held in a conduction state and the n-channel inverter transistor 18 in a non-conduction state in the second inverter.

The bit lines B and $\bar{B}$ are connected to data buses D and $\bar{D}$ through the drain/source current paths of n-channel field-effect transistors 24 and 26, respectively. These transistors 24 and 26 have their gates commonly connected to an output terminal of the column address decoder, viz., to a source of the previously mentioned column select signal Y as shown. Though not shown in the drawings, each of the word lines including the shown word line W and the bit lines including the shown bit lines B and $\bar{B}$ is connected to the source of the supply voltage $V_{DD}$ across a suitable precharge transistor having its gate connected to a source of a precharge enable clock pulse.

The prior-art memory device shown in FIG. 1 further includes a sense amplifier circuit 28 provided between the data buses D and $\bar{D}$. The sense amplifier circuit 28 includes a pair of load transistors 30 and 32 each provided by a p-channel field-effect transistor and a pair of amplifier transistors 34 and 36 each provided by an n-channel MOS field-effect transistor. The load transistors 30 and 32 have their sources connected to a voltage supply line for the supply voltage $V_{DD}$ and their drains connected to the drains of the amplifier transistors 34 and 36, respectively. The load transistors 30 and 32 further have their gates commonly connected to ground line to provide certain on-state resistances. The amplifier transistors 34 and 36 have their gates connected to the data buses D and $\bar{D}$, respectively, and their sources commonly connected to ground line commonly through an activating transistor 38 which is provided by an n-channel MOS field-effect transistor. The activating transistor 38 has its drain connected to the respective sources of the amplifier transistors 34 and 36 through a common node 40, its source connected to ground line, and its gate connected to a clock supply line 42 for an active-high activating clock signal $\phi_{SE}$. Between the common drains of the load and amplifier transistors 30 and 34 and the common drains of the load and amplifier transistors 34 and 36 are provided first and second sense nodes $N_1$ and $N_2$ from which first and second output lines 44 and 46 lead to an external device such as a microprocessor (not shown).

Operation of the sense amplifier circiut 28 of the prior-art static RAM device thus constructed and arranged will now be described with reference to FIG. 1 and further to FIGS. 2A and 2B. In FIG. 2A, curves indicated by B and $\bar{B}$ represent the potentials which occur on the bit lines B and $\bar{B}$, respectively, and curves indicated by D and $\bar{D}$ represent the potentials which occur on the data buses D and $\bar{D}$, respectively. Curves $N_1$ and $N_2$ represent the potential which occurs at the first and second output nodes $N_1$ and $N_2$ in the sense amplifier circuit 28, viz., at the first and second output lines 44 and 46, respectively. Furthermore, curves $A_X$, $A_Y$ and $\phi_{SE}$ represent the voltage levels of the word line select signal $A_X$, bit line select signal $A_Y$ and activating clock signal $\phi_{SE}$, respectively. As previously noted, it is assumed for purposes of discussion that the shown memory cell 10 has memorized therein a logic "0" bit of information and is to be selected during the current read cycle of the RAM device. A voltage approximating ground level $V_{SS}$ is to appear on the true bit line B and accordingly on the data bus D and a voltage approximating the supply voltage $V_{DD}$ is to appear on the complementary bit line $\overline{B}$ and accordingly on the data bus $\overline{D}$ during the current read cycle.

At an incipient stage of the read cycle, the word line W is precharged to ground level $V_{SS}$ and the bit line B and $\overline{B}$ and accordingly the data bases D and $\overline{D}$ are precharged to a level approximating the supply voltage $V_{DD}$. After the bit lines B and $\overline{B}$ and accordingly the data bases D and $\overline{D}$ are thus precharged to high levels, the potentials at the bit lines B and $\overline{B}$ and data bases D and $\overline{D}$ are allowed to float at the high levels approximating the supply voltage $V_{DD}$. With the potentials of such high levels established at the gates of the amplifier transistors 34 and 36, each of these n-channel field-effect transistors 34 and 36 is conditioned to be ready to turn on.

When a word line select signal $A_X$ is applied to the word line W and a bit line select signal $A_Y$ applied to the gates of the n-channel transistors 24 and 26, the memory cell 10 storing the logic "0" bit of information is selected and is connected to the data bus pair $D/\overline{D}$ at time $t_0$ (FIG. 2A). As the potential on the word line W thus activated by the word line select signal $A_X$ rises and reaches the level of the threshold voltage $V_{TN}$ of each of the n-channel gating transistors 20 and 22 of the memory cell 10 as at time $t_1$, the output nodes of the first and second inverters forming the memory cell 10 are connected to the bit lines B and $\overline{B}$ through the gating transistors 20 and 22, respectively. The potential on the true bit line B and accordingly the associated data bus D now begins to decline gradually toward the ground level $V_{SS}$ with the potential on the complementary bit line $\overline{B}$ and the associated data bus $\overline{D}$ maintained at the level approximating the supply voltage $V_{DD}$ as will be seen from FIG. 2A.

The activating clock signal $\phi_{SE}$ on the clock supply line 42 also swings to a high level ($V_{DD}$) at time $t_0$ and is supplied to the gate of the activating transistor 38. The activating transistor 38 is now turned on so that the potential at the common node 40 between the amplifier transistors 34 and 36 drops from the level approximating the supply voltage $V_{DD}$ toward the ground level $V_{SS}$ through the transistor 38. With the potentials of high levels present at the gates of the amplifier transistors 34 and 36 at time $t_0$, each of the n-channel field-effect transistors 34 and 36 is maintained in a conduction state at time $t_0$.

The potential at the common node 40 is reduced to the ground level $V_{SS}$ through the activating transistor 38 which has been turned on by the activating clock signal $\phi_{SE}$. Establishment of the potential of ground level $V_{SS}$ at the common node 40 creates a differential voltage between the data bus D and the common node 40 and a differential voltage between the data bus $\overline{D}$ and the common node 40. As the potential on the data bus D declines, the differential voltage between the gate and source of the first amplifier transistor 34 is gradually reduced toward the threshold voltage $V_{TN}$ of the n-channel transistor 34. This results in a growing decrease in the channel conductance of the transistor 34 so that, after time $t_1$, the potential at the first sense node $N_1$ begins to rise toward the initial level approximating the supply voltage $V_{DD}$ as will be seen from FIG. 2A. On the other hand, the development of the differential voltage between the data bus $\overline{D}$ and the common node 40 results in an increase in the channel conductance of the second amplifier transistor 36 with the potential on the data bus $\overline{D}$ and accordingly at the gate of the second amplifier transistor 36 maintained at a level approximating the supply voltage $V_{DD}$. It therefore follows that the potential at the second sense node $N_2$ drops toward a certain level $V_{N2}$ dictated by the on-state resistances of the series connected transistors 32, 36 and 38, thereby expanding the difference between the potentials at the nodes $N_1$ and $N_2$. As the potential on the data bus D further declines, the differential voltage between the gate and source of the first amplifier transistor 34 reaches the level of the threshold voltage $V_{TN}$ of the n-channel transistor 34 as at time $t_2$. The transistor 34 is now turned off so that the potential at the first sense node $N_1$ reaches the initial level approximating the supply voltage $V_{DD}$. The differential voltage between the data buses D and $\overline{D}$ is in these manners amplified into the differential voltage $V_{DD}-V_{N2}$ between the first and second sense nodes $N_1$ and $N_2$ as will be seen from FIG. 2A. Such an amplified differential voltage $V_{DD}-V_{N2}$ produced between the output lines 44 and 46 is supplied to the external device such as a microprocessor (not shown) as an output signal $V_{OUT}$ representative of the logic "0" bit of information read out from the memory cell 10. After the operation to read the information from the memory cell 10 is complete, the potential on the bit line B and data bus D still continues to fall gradually through the threshold voltage of the n-channel transistor 34 toward the ground level as will be seen from FIG. 2A.

Before the gating transistor 20 of the memory cell 10 is turned on with the word line W selected and activated with the word line select signal $A_X$, viz., prior to the time $t_0$ indicated in FIG. 2A, all the transistors 30, 32, 34 and 36 are maintained in conduction states as discussed previously. Under this condition, two current paths are established in the sense amplifier circuit 28 one through the transistors 30, 34 and 38 and the other through the transistors 32, 36 and 38 to the ground line. A current equal to the sum of the currents which flow through these two current paths thus flows from the source of the supply voltage $V_{DD}$ to the ground line through the activating transistor 38. When the potential on the data line D thereafter begins to decline at time $t_0$, there results a gradual decrease in the channel conductance of the amplifier transistor 34 so that the current flowing through the activating transistor 38 begins to decline as indicated by curve $I_{38}$ in FIG. 2B. After the potential on the data bus D is reduced to the level of the threshold voltage $V_{TN}$ of the n-channel transistor 34 at time $t_2$ and the transistor 34 is turned off, the current path through the transistors 30 and 34 is blocked so that the current allowed to flow through the activating transistor 38 is reduced as shown in FIG. 2B to a certain value dictated by the on-state resistances of the series connected transistors 32, 36 and 38.

Until the amplifier transistor 34 is turned off to block the current path through the transistors 30 and 34, a relatively large current is thus allowed to path through the activating transistor 38 for a period of time intervening between the times $t_0$ and $t_2$. This gives rise to an increase in the amount of power dissipation by the memory device using the sense amplifier under consideration. The goal of the present invention is to significantly reduce such power dissipation in a sense amplifier circuit of a semiconductor memory device of, for example, the described nature.

DESCRIPTION OF THE PREFERRED EMBODIMENTS

Figure 3:
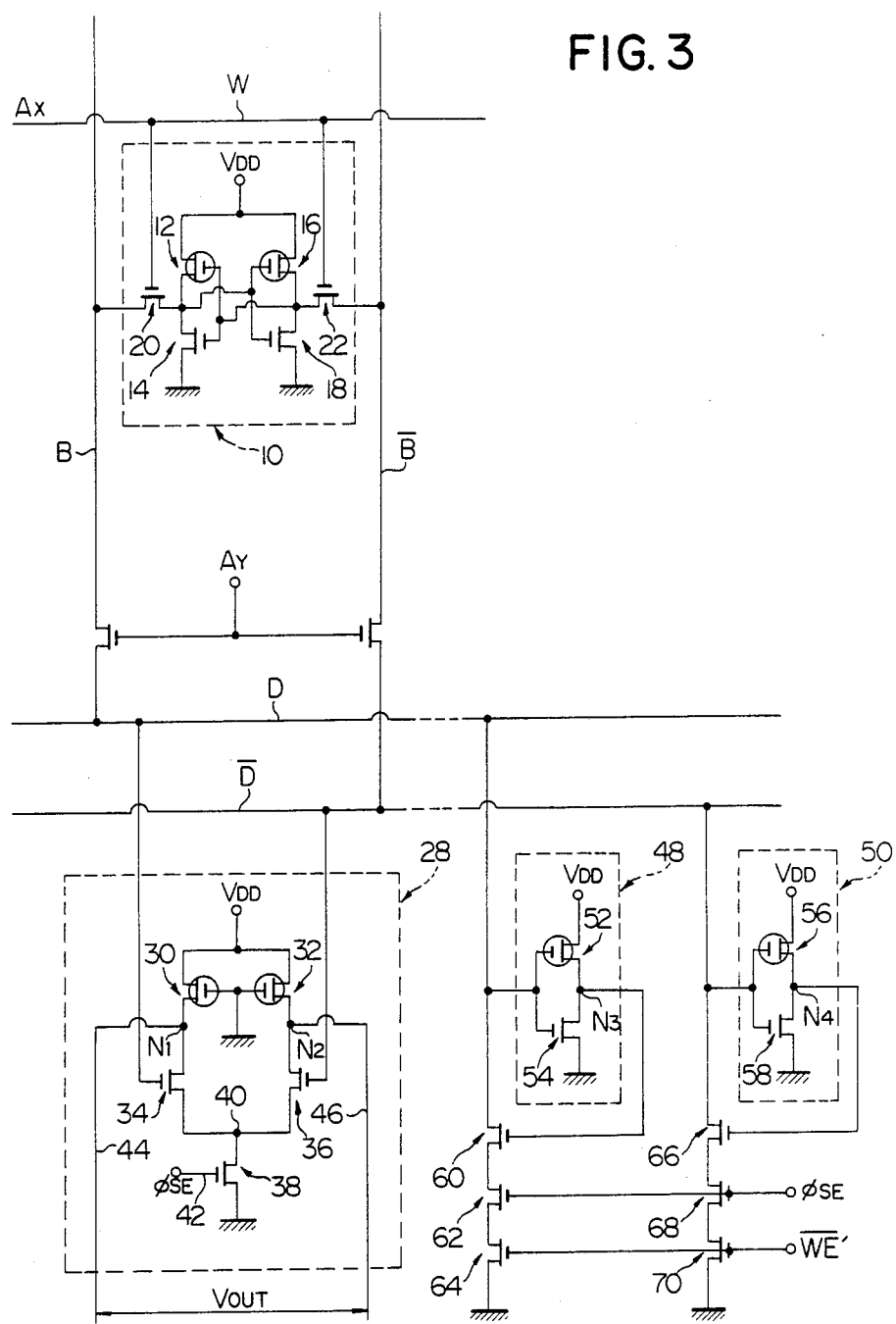
FIG. 3 is a circuit diagram showing the circuit arrangement of a static semiconductor memory device incorporating a first preferred embodiment of a sense amplifier circuit according to the present invention.

A sense amplifier circuit embodying the present invention is assumed, by way of example, to be incorporated in a semiconductor memory device essentially similar to that described with reference to FIG. 1. In FIG. 3, the sense amplifier circuit embodying the present invention is thus shown provided in association with a memory cell 10 provided between bit lines B and $\overline{B}$ which are crossed by a word line W. The sense amplifier circuit per se is basically similar in construction and arrangement to the prior-art sense amplifier described with reference to FIG. 1 and is shown comprising a differential amplifier 28 which is similar to the sense amplifier circuit 28 in the prior-art memory device of FIG. 1. The differential amplifier 28 forming part of the sense amplifier circuit embodying the present invention thus comprises first and second load transistors 30 and 32, first and second amplifier transistors 34 and 36, and an activating transistor 38. Each of the load transistors 30 and 32 is provided by a p-channel MOS field-effect transistor and each of the amplifier transistors 34 and 36 and activating transistor 38 is provided by an n-channel MOS field-effect transistor, as in the prior-art sense amplifier shown in FIG. 1.

In accordance with the present invention, the sense amplifier circuit further comprises first and second CMOS inverters 48 and 50 operatively connected to the data buses D and $\overline{D}$, respectively, and each intervening between the source of the supply voltage $V_{DD}$ and the ground line. The first CMOS inverter 48 consists of a p-channel field-effect transistor 52 and an n-channel field-effect transistor 54 and, similarly, the second CMOS inverter 50 consisting of a p-channel field-effect transistor 56 and an n-channel field-effect transistor 58. The p-channel and n-channel field-effect transistors 52 and 54 of the first inverter 48 have their gates commonly connected to the data bus D and, likewise, the p-channel and n-channel field-effect transistors 56 and 58 of the second inverter 50 have their gates commonly connected to the data bus $\overline{D}$. The p-channel field-effect transistors 48 and 50 have their respective sources connected the source of the supply voltage $V_{DD}$ and the n-channel field-effect transistors 54 and 58 have their sources connected to ground line. Furthermore, the respective drains of the transistors 52 and 54 of the first inverter 48 provide an output terminal $N_3$ of the inverter 48 and the respective drains of the transistors 56 and 58 of the second inverter 50 provide an output terminal $N_4$ of the inverter 50.

The sense amplifier circuit embodying the present invention further comprises a first series combination of n-channel field-effect transistors 60, 62 and 64 and a second series combination of n-channel field-effect transistors 66, 68 and 70. The field-effect transistors 60 and 66 have their gates connected to the above mentioned output terminals $N_3$ and $N_4$, respectively, of the first and second inverters 48 and 50 and their drains connected to the data buses D and $\overline{D}$, respectively. The field-effect transistors 62 and 68 have their gates commonly connected to the supply source of the active-high activating clock signal $\phi_{SE}$ and their drains connected to the sources of the transistors 60 and 66, respectively. Furthermore, the field-effect transistors 64 and 70 have their gates commonly connected to a supply source of an active-low write control signal $\overline{WE'}$, their drains connected to the sources of the transistors 62 and 68, respectively, and their sources connected to ground line as shown. As in the prior-art arrangement shown in FIG. 1, it is assumed for purposes of discussion that the shown memory cell 10 has memorized therein a logic "0" bit of information and is to be selected during the current read cycle of the RAM device. Each of the activating clock signal $\phi_{SE}$ and the write enable signal $\overline{WE'}$ is to be maintained at a high level approximately the supply voltage $V_{DD}$ during active mode of a read cycle.

At an incipient stage of the read cycle, the word line W is precharged to ground level $V_{SS}$ and the bit lines B and $\overline{B}$ and accordingly the data bases D and $\overline{D}$ are precharged to a level approximately the supply voltage $V_{DD}$ (of, for example, 5 volts). After the bit lines B and $\overline{B}$ and accordingly the data bases D and $\overline{D}$ are thus precharged to high levels, the potentials at the bit lines B and $\overline{B}$ and data bases D and $\overline{D}$ are allowed to float at the high levels approximately the supply voltage $V_{DD}$. With the potentials of such high levels established at the gates of the amplifier transistors 34 and 36, each of these n-channel field-effect transistors 34 and 36 is conditioned to be ready to turn on.

When, now, a word line select signal $A_X$ is applied to the word line W and a bit line select signal $A_Y$ applied to the gates of the n-channel transistors 24 and 26, the memory cell 10 storing the logic "0" bit of information is selected and is connected to the data bus pair D/$\overline{D}$ at time $T_0$ (FIG. 2A). As the potential on the word line W thus activated by the word line select signal $A_X$ rises and reaches the level of the threshold voltage $V_{TN}$ of each of the n-channel gating transistors 20 and 22 of the memory cell 10 as at time $T_1$, the output nodes of the first and second inverters forming the memory cell 10 are connected to the bit lines B and $\overline{B}$ through the gating transistors 20 and 22, respectively. The potential on the true bit line B and accordingly the associated data bus D now begins to decline gradually toward the ground level $V_{SS}$ with the potential on the complementary bit line $\overline{B}$ and the associated data bus $\overline{D}$ maintained at the level approximating the supply voltage $V_{DD}$ as will be seen from FIG. 4A.

The activating clock signal $\phi_{SE}$ on the clock supply line 42 also swings to a high level ($V_{DD}$) at time $T_0$ and is supplied to the gate of the activating transistor 38 of the sense amplifier circuit. The activating transistor 38 is now turned on so that the potential at the common node 40 between the amplifier transistors 34 and 36 drops from the level approximating the supply voltage $V_{DD}$ toward the ground level $V_{SS}$ through the transistor 38. With the potentials of high levels present at the gates of the amplifier transistors 34 and 36 at time $T_0$, each of the n-channel field-effect transistors 34 and 36 is maintained in a conduction state at time $T_0$.

The potential at the common node 40 is reduced to the ground level $V_{SS}$ through the activating transistor 38 which has been turned on by the activating clock signal $\phi_{SE}$. Establishment of the potential of ground level $V_{SS}$ at the common node 40 results in development of a differential voltage between the data bus D and the common node 40 and a differential voltage between the data bus $\overline{D}$ and the common node 40. As the potential on the data bus D declines, the differential voltage between the gate and source of the first amplifier transistor 34 is gradually reduced toward the threshold voltage $V_{TN}$ of the n-channel transistor 34. This results in a growing decrease in the channel conductance of the transistor 34 so that, after time $T_1$, the potential at the first sense node $N_1$ begins to rise toward the initial level approximating the supply voltage $V_{DD}$ as will be seen from FIG. 4A. On the other hand, the development of the differential voltage between the data bus $\overline{D}$ and the common node 40 results in an increase in the channel conductance of the second amplifier transistor 36 with the potential on the data bus $\overline{D}$ and accordingly at the gate of the second amplifier transistor 36 maintained at a level approximating the supply voltage $V_{DD}$ with which the data bus $\overline{D}$ has been precharged. It therefore follows that the potential at the second sense node $N_2$ drops toward a certain level $V_{N2}$ dictated by the on-state resistances of the series connected transistors 32, 36 and 38, with consequent expansion of the difference between the potentials at the nodes $N_1$ and $N_2$.

As long as the potential on the data bus D remains higher than the threshold voltage $V_{TN}$ of the n-channel field-effect transistor 54 of the first inverter 48, the particular transistor 54 is maintained in a conduction state so that there is established a potential of the ground level $V_{SS}$ at the output terminal $N_3$ of the first inverter 48. The n-channel field-effect transistor 60 associated with the first inverter 48 is accordingly maintained in a non-conduction state isolating the data bus D from the ground line. A potential of the ground level $V_{SS}$ is also established at the output terminal $N_4$ of the second inverter 50 as shown in FIG. 4A with a potential approximating the supply voltage $V_{DD}$ maintained at the data bus $\overline{D}$. As the potential on the data bus D declines toward the threshold voltage $V_{TN}$ of the n-channel field-effect transistor 54 of the first inverter 48, the n-channel field-effect transistor 54 begins to turn off and, in turn, the p-channel field-effect transistor 52 begins to turn on in the first inverter 48. When the potential on the data bus D thus reaches the threshold voltage $V_{TN}$ of the transistor 54 as at time $T_2$, the transistor 54 is turned off and the transistor 52 turned on so that the potential at the output terminal $N_3$ swings to a high level approximating the supply voltage $V_{DD}$ as will be seen from FIG. 4A. The n-channel field-effect transistor 60 associated with the first inverter 48 is therefore activated to turn on to permit the data bus D to connect to the ground line through the transistor 60 and further by way of the transistors 62 and 64 which are maintained conductive by the signals $\phi_{SE}$ and $\overline{WE}'$ of high levels. The charges on the data bus D are now allowed to flow through the series combination of the n-channel field-effect transistors 60, 62 and 64 to the ground line with the result that the potential at the output terminal $N_3$ of the first inverter 48 falls at an increased rate through the threshold level $V_{TN}$ toward the ground level as shown in FIG. 4A.

As the potential on the data bus D falls through the threshold level $V_{TN}$ as at time $T_3$, the first amplifier transistor 34 of the sense amplifier circuit is turned off so that the potential at the first sense node $N_1$ reaches the initial level approximating the supply voltage $V_{DD}$. The differential voltage between the data buses D and $\overline{D}$ is in these manners amplified into the differential voltage $V_{DD}-V_{N2}$ between the first and second sense nodes $N_1$ and $N_2$ as will be seen from FIG. 4A. Such an amplified differential voltage $V_{DD}-V_{N2}$ produced between the output lines 44 and 46 is supplied to the external device such as a microprocessor (not shown) as an output signal $V_{OUT}$ representative of the logic "0" bit of information read out from the memory cell 10.

Before the transistor 60 associated with the first inverter 48 is turned on, viz., prior to the time $T_2$ indicated in FIG. 4A, the potential on the data bus D declines at a rate equal the rate at which the potential on the data bus D falls in the prior-art arrangement of FIG. 1. Accordingly, two current paths are also formed in the sense amplifier circuit one through the transistors 30, 34 and 38 and the other through the transistors 32, 36 and 38 to the ground line. During the period of time preceding to the time $T_2$ indicated in FIG. 4A, a current equal to the that which flows through the activating transistor 38 in the arrangement of FIG. 1 is thus also allowed to flow from the source of the supply voltage $V_{DD}$ to the ground line through the transistor 38 in the sense amplifier circuit embodying the present invention. Once the data bus D is connected to the ground line through the series combination of the transistors 60, 62 and 64 as above discussed, the differential voltage between the gate and source of the first amplifier transistor 34 falls abruptly so that the current allowed to pass over to the ground line through the transistors 34 and 38 of the sense amplifier circuit decreases at an increased rate as will be seen from curve $I_{38}$ in FIG. 4B. After the potential on the data bus D is reduced past the level of the threshold voltage $V_{TN}$ of the amplifier transistor 34 so that the transistor 34 is turned off at time $T_3$, the current path through the transistors 30 and 34 is blocked and there is no current allowed to pass through the transistors 30 and 34 to the activating transistor 38. The current allowed to flow through the activating transistor 38 is now reduced as shown in FIG. 2B to a certain value dictated by the on-state resistances of the series connected transistors 32, 36 and 38.

While only one preferred embodiment of a sense amplifier circuit according to the present invention has been hereinbefore described and shown, it will be apparent that such an embodiment is merely for purposes of illustration of of the gist of the present invention and may therefore be modified in numerous manners where desired. Although, for example, it has been described that a sense amplifier circuit according to the present invention is embodied in a static RAM device of the CMOS configuration, the subject matter of the present invention is applicable to semiconductor memory devices of any other types and/or designs.

What is claimed is:

1. A sense amplifier circuit comprising
   (a) first and second input lines to which voltages with a difference therebetween are to be applied respectively,
   (b) a differential amplifier provided between sources of voltages of high and low levels and having a pair of input terminals respectively connected to said first and second input lines,
   (c) first and second inverter means each having an input terminal and an output terminal, the input terminal of the first inverter means being connected to said first input line and the input terminal of the second inverter means being connected to said second input line,
   (d) a first transistor having a current path provided between said first input line and the source of said voltage of low level and a control terminal connected to the output terminal of said first inverter means, and
   (e) a second transistor having a current path provided between said second input line and the source of said voltage of low level and a control terminal connected to the output terminal of said second inverter means.

2. A differential amplifier circuit comprising
(a) first and second input lines to which potentials with a difference therebetween are to be applied respectively,
(b) a series combination of a first load transistor and a first amplifier transistor having respective current paths connected in series between a source of a voltage of high level and said common node,
(c) a series combination of a second load transistor and a second amplifier transistor having respective current paths connected in series between a source of a voltage of low level and said common node, and
(d) activating means having a current path connected between said common node and said source of the voltage of low level for activating each of the first and second amplifier transistors when said current path of said activating means is conductive,
(e) each of said first and second load transistors and said first and second amplifier transistors having input and output terminals and a control terminal, the control terminals of the first and second amplifier transistors being biased to render said first and second load transistors conductive, the control terminal of said first amplifier transistor being connected to said first input line and the control terminal of said second amplifier transistor being connected to said second input line,
(f) first and second inverter means each having an input terminal and an output terminal, the input terminal of the first inverter means being connected to said first input line and the input terminal of the second inverter means being connected to said second input line,
(g) a first transistor having a current path provided between said first input line and the source of said voltage of low level and a control terminal connected to the output terminal of said first inverter means, and
(h) a second transistor having a current path provided between said second input line and the source of said voltage of low level and a control terminal connected to the output terminal of said second inverter means, and
(i) means for controlling said activating means.

3. A differential amplifier circuit as set forth in claim 1 or 2, wherein each of said first and second inverter means comprises a CMOS (complementary metal-oxide-semiconductor) inverter circuit.

4. A differential amplifier circuit comprising
(a) first and second input lines to which potentials with a difference therebetween are to be applied respectively,
(b) a first series combination of load and amplifier transistors each having a current path and a control terminal,
(c) a second series combination of load and amplifier transistors each having a current path and a control terminal,
(d) an activating transistor having a current path and a control terminal,
(e) the load and amplifier transistors of each of said first and second series combinations having their respective current paths connected between sources of voltages of high and low levels through the current path of said activating transistor, the respective load transistors of said first and second series combinations having their control terminals coupled together to a predetermined potential, the amplifier transistor of said first series combination having its control terminal connected to said first input line and the amplifier transistor of said second series combination having its control terminal connected to said second input line,
(f) first and second inverter means each having an input terminal and an output terminal, the input terminal of the first inverter means being connected to said first input line and the input terminal of the second inverter means connected to said second input line,
(g) a first transistor having a current path connected between said first input line and the source of said voltage of low level and a control terminal connected to the output terminal of said first inverter means,
(h) a second transistor having a current path connected between said second input line and the source of said voltage of low level and a control terminal connected to the output terminal of said second inverter means, and
(i) means for controlling said activating transistor.

5. A differential amplifier circuit comprising
(a) first and second signal lines to which potential with a difference therebetween are to be applied respectively,
(b) a differential amplifier having first and second input terminals,
(c) means for connecting said first input terminal to said first signal line,
(d) means for connecting said second input terminal to said second signal line,
(e) a first discharge circuit connected between said first signal line and a reference voltage source for releasing charges through said first signal line toward said reference voltage source,
(f) a second discharge circuit connected between said second signal line and said reference voltage source for releasing charges through said second signal line toward said reference voltage source,
(g) a first control circuit connected to said first signal line and to said first discharge circuit for selectively enabling said first discharge circuit when a potential on said first signal line is lower than a predetermined level,
(h) a second control circuit connected to said second signal line and to said second discharge circuit for selectively enabling said second discharge circuit when a potential on said second signal line is lower than said predetermined level, and
(i) means for enabling said differential amplifier when one of said first and second discharge circuits is enabled.

6. A differential amplifier circuit as set forth in claim 5, in which each of said first and second discharge circuits has a control terminal and in which each of said first and second control circuits comprises an inverter having an input terminal connected to one of said first and second signal lines and an output terminal connected to the control terminal of one of said first and second discharge circuits.

7. A differential amplifier circuit as set forth in claim 6, in which said differential amplifier comprises:
a first series circuit of a load element and a transistor having respective current paths connected in series between a power supply terminal and a common node, a second series circuit of a load element and a transistor having respective current paths connected in series between said power supply terminal and said common node, and a transistor having a current path connected in series between said common node and said reference voltage source.

8. A differential amplifier circuit as set forth in claim 5, in which each of said first and second discharge circuit comprises a discharge transistor having a current path and a control terminal and means for having the current path of the discharge transistor of each discharge circuit connected between one of said first and second signal lines and said reference voltage source.

* * * * *